(12) United States Patent
Xu et al.

(10) Patent No.: US 6,207,554 B1
(45) Date of Patent: Mar. 27, 2001

(54) GAP FILLING PROCESS IN INTEGRATED CIRCUITS USING LOW DIELECTRIC CONSTANT MATERIALS

(75) Inventors: Yi Xu; Jia Zhen Zheng; Jane C. M. Hui; Charles Lin; Yih Shung Lin, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/351,237

(22) Filed: Jul. 12, 1999

(51) Int. Cl.[7] .............................................. H01L 21/4763
(52) U.S. Cl. ........................ 438/624; 438/633; 438/627; 438/628; 438/637
(58) Field of Search ................................. 438/624–627, 438/622–623, 618, 687, 688, 631, 633, 637–640

(56) References Cited

U.S. PATENT DOCUMENTS

| | | | |
|---|---|---|---|
| 5,219,792 | * 6/1993 | Kim et al. | 438/631 |
| 5,385,866 | 1/1995 | Bartush | 437/186 |
| 5,496,776 | * 3/1996 | Chien et al. | 438/624 |
| 5,759,906 | 6/1998 | Lou | 438/623 |
| 5,818,111 | 10/1998 | Jeng et al. | 257/776 |
| 5,821,621 | 10/1998 | Jeng | 257/759 |

* cited by examiner

Primary Examiner—Charles Bowers
Assistant Examiner—Thanh Nguyen
(74) Attorney, Agent, or Firm—George O. Saile; Rosemary L. S. Pike

(57) ABSTRACT

It is the general object of the present invention to provide an improved method of fabricating semiconductor integrated circuit devices, specifically by describing an improved process of fabricating multilevel metal structures using low dielectric constant materials. The present invention relates to an improved processing methods for stable and planar intermetal dielectrics, with low dielectric constants. The first embodiment uses a stabilizing adhesion layer between the bottom, low dielectric constant layer and the top dielectric layer. The advantages are: (i) improved adhesion and stability of the low dielectric layer and the top dielectric oxide (ii) over all layer thickness of the dielectric layers can be reduced, hence lowering the parasitic capacitance of these layers. In the second embodiment, the method uses a multi-layered "hard mask" on metal interconnect lines with a silicon oxynitride DARC, dielectric anti-reflective coating on top of metal. A double coating scheme of low dielectric constant insulators are used in this application. The third embodiment uses a hard mask stack over the interconnect metal lines, with a silicon oxynitride DARC costing on top of metal, and an adhesion layer between the low dielectric material and the top dielectric layer.

22 Claims, 5 Drawing Sheets

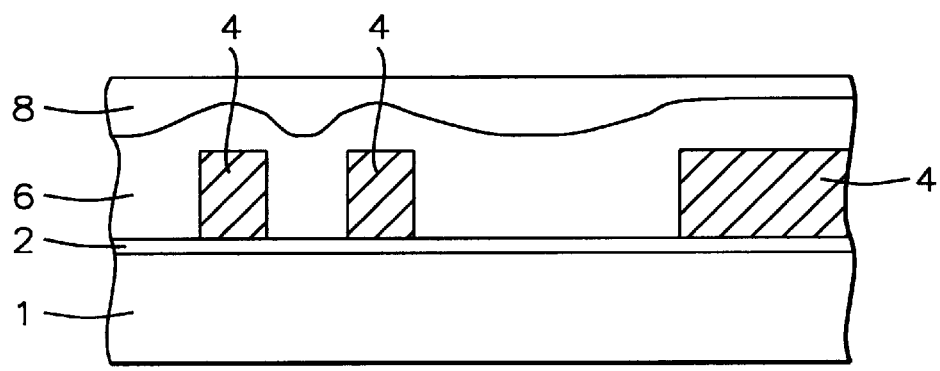
*FIG. 1a - Prior Art*
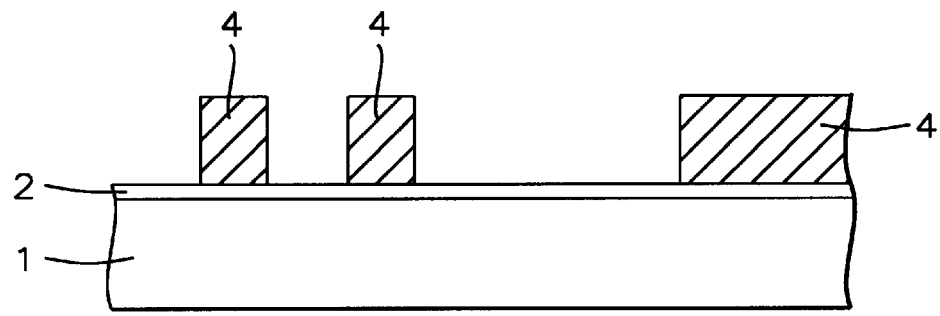
*FIG. 2a*
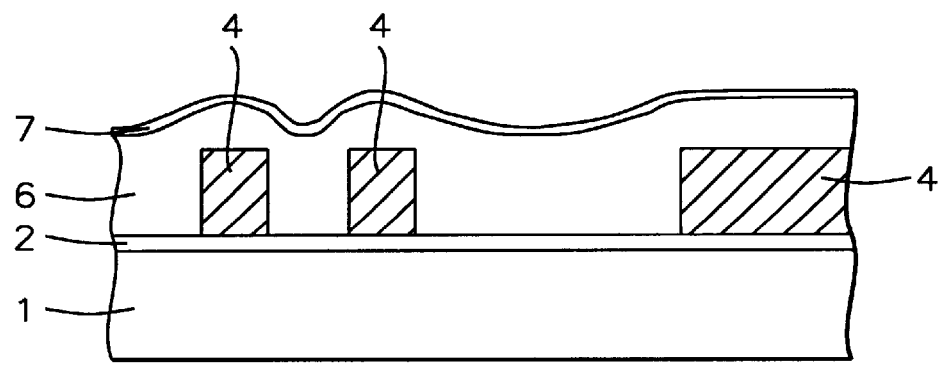
*FIG. 2b*

GAP FILLING PROCESS IN INTEGRATED CIRCUITS USING LOW DIELECTRIC CONSTANT MATERIALS

BACKGROUND OF THE INVENTION (1) Field of the Invention

This invention relates to a method of fabrication used for semiconductor integrated circuit devices, and more specifically it relates to structures for reducing capacitance between closely spaced interconnection lines of integrated circuits. In particular, it pertains to structures and methods for improving adhesion and preventing micro cracks in low dielectric constant materials when used in conjunction with conventional dielectric materials as intermetal dielectrics (IMD).

(2) Description of Prior Art

Integrated circuits and the progress made in Silicon Technology has continued to shrink the size of devices. This has led to closer and closer spacing of interconnection lines. As spacing becomes closer, the capacitance between adjacent lines has increased, as device geometries shrink and circuit densities increase. The capacitance between lines is directly related to both the distance between the lines and dielectric constant of the material in between the lines. Hence, a low dielectric material between the closely spaced interconnect lines is beneficial in reducing the capacitance.

In 0.25 micron, or below (e.g., 0.18, 0.13 um), technology the performance is limited by the interconnect line delay, with line-to-line capacitance being greatly affected by RC delay of the lines, as line width and line space becomes less than about 0.3 microns. Therefore, the introduction of low dielectric materials between the closely spaced interconnect, transmission lines can greatly enhance the integrated circuit performance in terms of speed, by lowering the RC time constants.

U.S. Pat. No. 5,818,111 entitled "Low Capacitance Interconnect Structures in Integrated Circuits Using a Stack of Low Dielectric Materials" granted Oct. 6, 1998 to Jeng and Taylor describes a method and structure for integrating hydrogen silsesqui-oxane (HSQ) and other low dielectric materials, which have undesirable properties, into integrated circuit structures and processes. A stabilizing layer is inserted between layers of low dielectric constant films. A layer of low dielectric constant HSQ is spun over and in between metal interconnect lines with a thin layer of silicon dioxide used as a stabilizing layer on top. Alternating layers of HSQ and thin silicon dioxide are fabricated together with multilevel metal structures. Finally, a thick silicon dioxide layer for planarization is placed on top of the multi-level metal layer structures.

U.S. Pat. No. 5,759,906 entitled "Planarization Method for Intermetal Dielectrics Between Multilevel Interconnections on Integrated Circuits" granted Jun. 2, 1998 to Lou describes a method for making a planar intermetal dielectric layer (IMD) for multilevel electrical interconnections on ULSI circuits. The method involves forming metal lines on which is deposited a conformal PECVD oxide. A multilayer of spin-on glass (SOG), composed of at least four layers, is deposited and baked at elevated temperatures and long times after each layer to minimize the poisoned via problem. After depositing a silicon dioxide layer on the SOG, the layer is partially chemical/mechanically polished to provide the desired, more global planar, IMD. The method can be repeated for multilevel metal lines.

U.S. Pat. No. 5,385,866 entitled "Polish Planarizing Using Oxidized Boron Nitride as a Polish Stop" granted Jan. 31, 1995 to Bartush shows a method of polishing of a non-planar surface layer on a semiconductor substrate using an oxidized boron nitride polishing stop layer. The oxidized boron nitride polish stop layer is selectively polished relative to the non-planar surface layer. The oxidized boron nitride acts as a polishing stop layer for the process over an FET gate structure.

U.S. Pat. No. 5,821,621 entitled "Low Capacitance Interconnect Structure for Integrated Circuits" granted Oct. 13, 1998 to Jeng shows a method for integrating polymer and other low dielectric constant materials, which may have undesirable physical properties, into integrated circuits structures and processes, especially those requiring multiple levels of interconnect lines. It combines the use of silicon dioxide with low dielectric constant materials. The low dielectric constant materials are spun-on and defined by photolithography to be only in the critical areas between interconnect lines. After planarization, the process steps can be repeated for multiple interconnect layers.

SUMMARY OF THE INVENTION

It is the general object of the present invention to provide an improved method of fabricating semiconductor integrated circuit devices, specifically by describing an improved process of fabricating multilevel metal structures using low dielectric constant materials. Furthermore, the present invention relates to an improved method for fabricating stable and planar intermetal dielectric materials, using low dielectric constant materials.

The method by the first embodiment of this invention, uses a stabilizing adhesion layer between the bottom, low dielectric constant layer and the top dielectric layer. The advantages of the stabilizing adhesion layer are: (i) improved adhesion and stability of the low dielectric layer and the top dielectric oxide (ii) over all layer thickness of the dielectric layers can be reduced, hence lowing the parasitic capacitance of these layers.

In the second embodiment of the present invention, the method uses a multi-layered "hard mask" on metal interconnect lines with an underlying silicon oxynitride DARC, dielectric anti-reflective coating. The term hard mask refers to these layers that exhibit resistance to being chemical-mechanical polished (CMP) back in the planarization process. A double coating scheme of low dielectric constant insulators are used in this application of the invention. Several advantages are achieved by this method: (i) improved global planarization with low dielectric constant material used in conjunction with hard mask (ii) adhesion and stabilizing material used between low dielectric material and oxide dielectric (iii) double coat of low dielectric material for whole interlevel metal dielectric (IMD) stack.

Still another object of this invention, is the third embodiment of the present invention, a multi-layered hard mask stack over the interconnect metal lines with silicon oxynitride DARC, dielectric anti-reflective coating, is used, and in addition, an adhesion and stabilization layer is used between the low dielectric material and the top dielectric layer. In this application of the invention, several advantages are achieved: (i) improved global planarization (ii) reduction of outgassing and via poisoning (iii) easy integration of low dielectric constant material.

The present invention starts with conventional processing of the semiconductor substrate and continues with conventional processing up to the fabrication of the first level of metal interconnect lines. A detailed description of the aforementioned conventional processing is found in the section titled, "DESCRIPTION OF THE PREFERRED EMBODIMENTS".

Integrated circuits and the progress made in Silicon Technology has continued to shrink the size of devices. This has led to closer and closer spacing of interconnection lines. As spacing becomes closer, the capacitance between adjacent lines has increased, as device geometries shrink and circuit densities increase. The capacitance between lines is directly related to both the distance between the lines and dielectric constant of the material in between the lines. Hence, a low dielectric material between the closely spaced interconnect lines is beneficial in reducing the capacitance.

In quarter micron technology and below, the performance is limited by the interconnect line delay, with line-to-line capacitance being greatly affected by RC delay of the lines, as line width and line space becomes less than about 0.3 microns. Therefore, the introduction of low dielectric materials between the closely spaced interconnect, transmission lines can greatly enhance the integrated circuit performance in terms of speed, by lowering the RC time constants.

This invention relates to a method of fabrication used for semiconductor integrated circuit devices, and more specifically it relates to structures for reducing capacitance between closely spaced interconnection lines of integrated circuits. In particular, it pertains to structures and methods for improving adhesion and preventing micro cracks in low dielectric constant materials when used in conjunction with conventional dielectric materials as intermetal dielectrics (IMD).

In the first embodiment of the present invention, conventional processing is used to fabricate the interconnect metal lines, which are defined on an interlevel dielectric layer (ILD) on a semiconductor substrate. A low dielectric constant material is then deposited on and in between the metal interconnect lines. Key to the process is the deposition of a thin non-oxide dielectric adhesion and stabilization layer, such as, silicon nitride, which is deposited on top of the low dielectric constant layer. Other adhesion and stabilization layers can be used, e.g., chemical vapor deposition (CVD) of SiC and related compounds of BC, BCN, BN or spun on materials. A cap silicon oxide is deposited onto the adhesion and stabilization layer and this cap oxide helps to planarize the surface. Further planarization of the surface is achieved by then chemical-mechanical polishing (CMP) of the top cap oxide. Finally in the process, via openings to contact the metal below are fabricated by defining the via area by photolithography and then etching the openings through: cap oxide, thin adhesion layer and then through the low dielectric material. Conductive metal is deposited into the via opening to connect the metal lines below. The excess conductive metal is then removed and the surface planarized by chemical-mechanical polish (CMP).

In another embodiment of the present invention, a multi-layered "hard mask" with silicon oxynitride DARC, dielectric anti-reflective coating, is used on top of metal. The term hard mask refers to the layers resistance to being chemical-mechanical polished (CMP) back. A layer of metal is deposited on the interlevel dielectric layer (ILD) and then a multi-layered hard mask layer, e.g., silicon nitride and silicon oxide layers, are deposited on top of the metal layer. This multi-layered hard mask layer, with silicon oxynitride DARC, dielectric anti-reflective coating on top of metal, can just be silicon nitride alone, or just silicon oxide, or can be the combination of both silicon nitride and silicon oxide. Next in the process is the masking and etching of the interconnect metal lines. Now with the hard mask in place over the defined metal lines, with silicon oxynitride DARC, dielectric anti-reflective coating on top of metal, a low dielectric constant layer is deposited over the surface and cured by a curing process. The low dielectric constant material is chemical-mechanical polished (CMP) back with the multi-layered hard mask in place over the metal with silicon oxynitride DARC, dielectric anti-reflective coating on top of metal. The surface is planarized by the CMP and the CMP process stops on the hard mask, removing some of the hard mask in the process, e.g., silicon oxide. Some of the hard mask remains as the silicon nitride layer. At this stage in the process, this invention branches off into two separate embodiments. One embodiment involves a another coating (the second) of low dielectric constant material and followed by the deposition of another single or multiple layers of hard mask material on top of low dielectric constant material. The other embodiment, which branches off involves the use of an adhesion promoter and stabilization layer in between thicker cap oxide and low dielectric layer. Combinations of these two branch processes can also be applied. A more detailed description of each branch is given in the next few paragraphs.

In the second embodiment of the invention, the process follows the same scheme described above using the hard mask process. Next, a second layer of low dielectric constant material, or double coating, is applied over a hard mask, which consisting of a non-oxide dielectric layer, such as, silicon nitride. Another hard mask layer, for low dielectric constant via open is deposited over the second low dielectric layer. This second hard mask layer can be composed of just silicon nitride, or just silicon oxide or both materials. This process is followed by via definition and etching for via openings. Conductive metal is deposited and excess metal is chemical-mechanical polished (CMP) back to form electrically conductive vias to the interconnect metal lines below.

In the third embodiment of the invention, the process follows the same scheme described above using the hard mask process. A thin layer of adhesion promoter, silicon nitride, is deposited both over the hard mask and the low dielectric constant layer. Next a cap oxide layer is deposited. This process is followed by via definition and etching for via opening. Conductive metal is deposited and excess metal is chemical-mechanical polished (CMP) back to form electrically conductive vias to the interconnect metal lines below.

In summary, several embodiments of this invention were described: (i) the use of a non-oxide dielectric adhesion promoter for cap oxide (ii) the use of a double coating of low dielectric constant material and multi-layered hard mask material (iii) the use of a hard mask material, in combination with, the use of an adhesion promoter for cap oxide. Other combinations of the above embodiments are possible and should be understood as part of this invention.

BRIEF DESCRIPTION OF THE DRAWINGS

The object and other advantages of this invention are best described in the description of the preferred embodiments with reference to the attached drawings that include:

FIG. 1 *a* which in cross-sectional representation illustrate the prior art method of forming low dielectric constant gap fill.

DESCRIPTION OF THE PREFERRED EMBODIMENTS

Figure 2C:
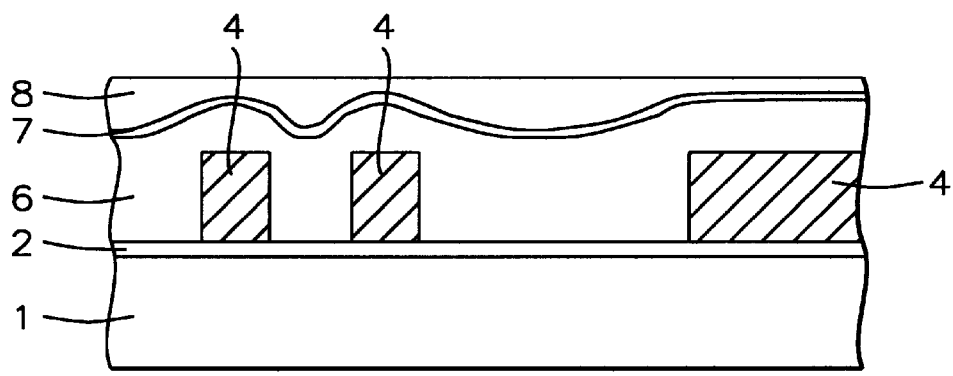
FIGS. 2 *a–d* illustrates one embodiment of the present invention using a non-oxide adhesion layer between dielectric layers.

The present invention relates to a method for fabricating planar intermetal dielectric materials. The method by the first embodiment uses a stabilizing adhesion layer between the bottom low dielectric constant layer and top dielectric layer. In the second embodiment of the present invention, the method uses a multi-layered "hard mask" on metal interconnect lines with a silicon oxynitride DARC, dielectric anti-reflective coating on top of metal. The term multi-layered hard mask refers to these layers that exhibit resistance to being chemical-mechanical polished (CMP) back in the planarization process. In the third embodiment of the present invention, a hard mask stack over the interconnect metal lines with silicon oxynitride DARC, dielectric anti-reflective coating, on top of metal, is used, and in addition, an adhesion and stabilization layer is used between the low dielectric material and the top dielectric layer.

As background to the present invention, a conventional method of fabricating intermetal dielectric (IMD) is illustrated as Prior Art in a cross-sectional sketch in FIGS. 1. As shown in FIG. 1, a semiconductor substrate 1 is the base starting material, such as single-crystal silicon on which are formed semiconductor devices. The devices are not shown in the Figs. to simplify the drawings and the discussion. For example, the method can be applied to integrated circuits having devices such as field effect transistors (FET's), bipolar transistors and the like made in and on the substrate surface. A first insulating layer 2 is deposited over the substrate 1 having semiconductor devices. Preferably the first insulating layer is composed of a silicon oxide ($SiO_2$) and is deposited by low pressure chemical vapor deposition (LPCVD), or by sub-atmospheric chemical vapor deposition (SACVD), using a reactant gas such as tetraethosiloxane (TEOS) and oxygen ($O_2$) or ozone ($O_3$). Preferably layer 2 is deposited to a thickness of between about 5000 and 10000 Angstroms. Layer 2 serves as the pre-metal interlevel dielectric (PMD) that provides electrical insulation of the devices from the level of metal interconnections that are made next.

Contact openings (not shown in Figs.) are etched in the first insulating layer 2 to form contacts to the devices, such as source/drain contact areas and gate electrodes of FET's, or to emitter, base and collector areas of bipolar devices. The contacts can be etched, for example, by high-density plasma (HDP) etching in an etchant gas such as trifluoromethane ($CHF_3$), which selectively etches the oxide to the silicon substrate 1. A barrier layer, which is not explicitly depicted in the Figs., is deposited over the first insulating layer 2 and in the contact openings. The barrier layer, typically composed of titanium (Ti)/titanium nitride (TiN) or titanium tungsten (TiW) is used to prevent aluminum penetration into the shallow junctions of the devices and to improve adhesion. A first conductive layer is now deposited and patterned to form defined interconnect metal lines 4, (with silicon oxynitride DARC, dielectric anti-reflective coating on top of metal), on the surface of a silicon oxide layer 2, the interlevel dielectric layer (ILD). A low dielectric constant, low k, material 6 is deposited over and in between the interconnect metal lines 4. Over the low dielectric material is a deposited "cap silicon oxide layer" 8 that helps to planarize the surface and can be chemical-mechanical polished (CMP) back to further planarize the surface. Multi-level interconnect metal line structures, with silicon oxynitride DARC, dielectric anti-reflective coating on top of metal, can be fabricated by this method. The low dielectric constant material in between and around the interconnect metal lines reduces the parasitic capacitance of the metal lines and hence increases signal speed and performance by lowering the RC time constant of the lines.

Several problems arise by this conventional method, shown in FIG. 1. One main concern is the adhesion of the cap oxide 8 to the underlying layer of low dielectric constant material 6. Other concerns are the introduction of reaction gases that include oxygen and nitrous oxide gases prior to the cap oxide deposition. These gases are necessary for reaction chamber stabilization and react with the surface of the low dielectric constant layer, making adhesion of the subsequent cap oxide worse. The present invention solves these problems, as described in the following section, starting with FIG. 2.

As shown in FIG. 2a, the interconnect metal lines 4 are defined on a semiconductor substrate 1 with an interlevel dielectric layer (ILD) 2, all with conventional processing. In FIG. 2b, one embodiment of the present invention is illustrated, showing a low dielectric constant material deposited on and in between the metal lines 4, but now a thin non-oxide adhesion layer, such as, silicon nitride 7 is deposited on top of the low dielectric constant layer 6. Other adhesion layers can be used, e.g., chemical vapor deposition (CVD) of SiC and related compounds of BC, BCN, BN or spun on materials.

The low dielectric constant material is spun on dielectric (SOD), especially useful are organic compounds, which are coated by the spin on method to a thickness from about 4,000 to 12,000 Angstroms. Curing conditions are: 1 hr. at 400° C., in a nitrogen ambient, with gas flow of between 1 to 30 LM. The low dielectric constant material has a dielectric constant of less than 2.8.

The deposition conditions of the non-oxide, dielectric layer, such as, the silicon nitride layer are, plasma enhanced chemical vapor deposition (PECVD): film thickness from about 200 to 500 Angstroms, temperatures from about 300 to 400° C., deposition rates from about 900 to 8,000 Angstroms/min, ammonia gas flow from about 80 to 200 sccm and silane gas flow from about 200 to 350 sccm, with pressures from about 1 to 10 Torr, RF power from about 400 to 800 Watts.

Figure 2D:
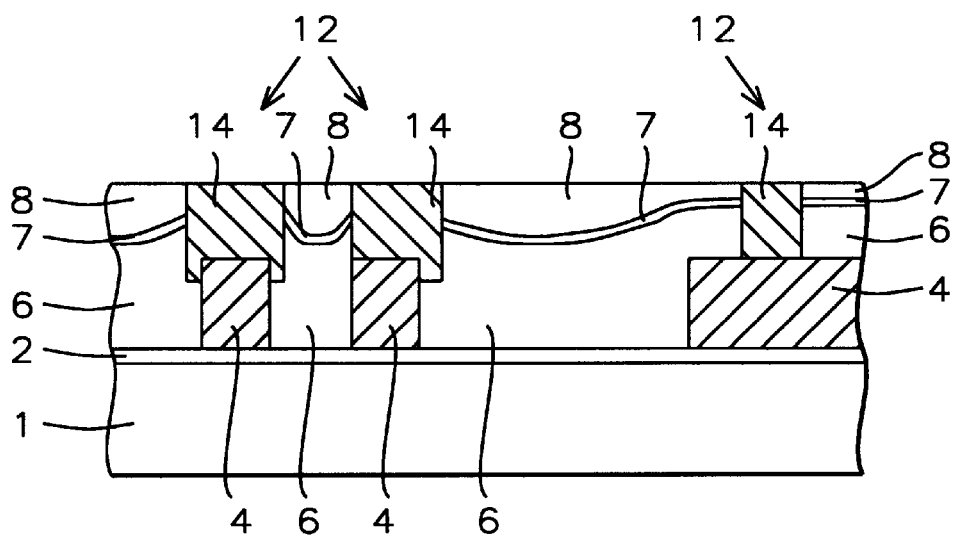

In FIG. 2c is sketched the cap silicon oxide 8 is deposited onto the adhesion layer 7 and this cap oxide helps to planarize the surface. Further planarization of the surface is achieved by then chemical-mechanical polishing (CMP) of the top cap oxide, as shown is FIG. 2c. Finally in the process, FIG. 2d, via openings are fabricated by defining the via area 12 by photolithography and then etching the openings through: cap oxide 8, thin adhesion layer 7 and low dielectric material 6. Conductive metal 14 is deposited into the via opening to connect the metal lines below. The excess conductive metal is then removed and the surface planarized by chemical-mechanical polish (CMP), as shown in FIG. 2d. The cap oxide is silicon oxide deposited by plasma enhanced chemical vapor deposition (PECVD), in the thickness range from about 4,000 to 16,000 Angstroms, and having a dielectric constant of about 4.0.

Another embodiment of the present invention is illustrated in FIG. 3. It can be termed, a multi-layered "hard mask" on metal with silicon oxynitride DARC, dielectric anti-reflective coating on top of metal stack. The term hard mask refers to the layers resistance to being chemical-mechanical polished (CMP) back. As shown in FIG. 3a, a layer of metal is deposited on an interlevel dielectric layer 2 and then a hard mask layer of silicon nitride 7 and silicon oxide layer 9 are deposited. This multi-layered hard mask (with silicon oxynitride DARC, dielectric anti-reflective coating on top of metal stack) can just be silicon nitride alone, or just silicon oxide, or can be the combination of both silicon nitride 7 and silicon oxide 9, as shown in FIG. 3a.

The silicon nitride deposition is the same, as described earlier, for plasma enhanced chemical vapor deposition (PECVD), with nitride thickness from about 200 to 500 Angstroms. The deposition conditions for the silicon oxide above are the following, plasma enhanced chemical vapor deposition (PECVD): film thickness from about 1,000 to 2,000 Angstroms, silane gas flow from about 70 to 200 sccm, nitrous oxide gas flow from about 1,500 to 3,000 sccm, pressure from about 1 to 10 Torr, temperature from about 300 to 400° C., and RF power from about 50 to 100 Watts.

Figure 3A:
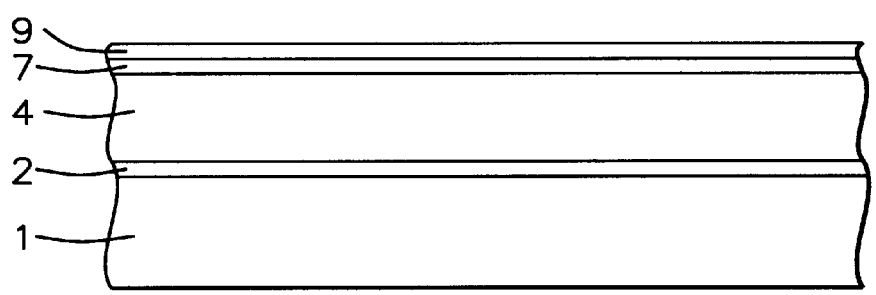
FIGS. 3 *a–d* illustrates another set of embodiments of the present invention using multi-layered hard mask process.
Figure 3B:
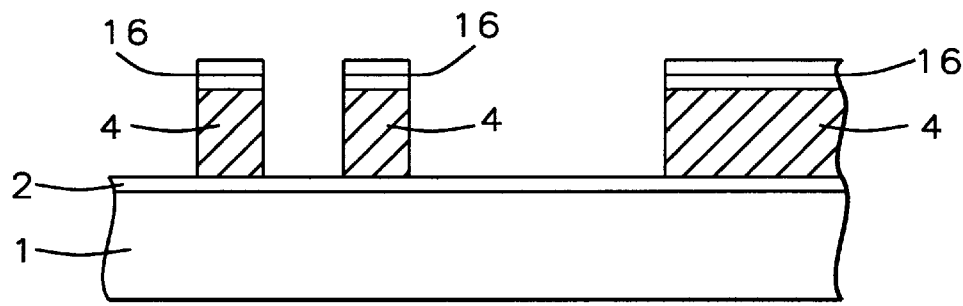
Figure 3C:
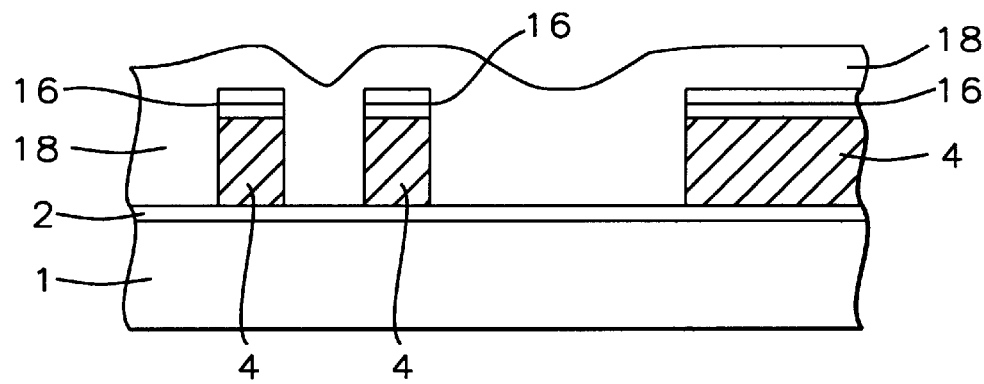

Next in the process is the masking and etching of the interconnect metal lines, as illustrated in FIG. 3b. Now with the hard mask 16 in place on the metal lines, a low dielectric constant layer 18 is deposited over the surface and cured by a curing process. This low dielectric material is a carbon based organic polymer, in a thickness range from about 4,000 to 10,000 Angstroms, spun on at spin speeds from about 2,000 to 4,000 rpm for a time of 1 minute. The curing process is at 400° C., for 1 hr., in ambient of nitrogen gas with flows from about 1 to 30 sccm and limiting oxygen concentrate to less than 10 ppm.

Figure 3D:
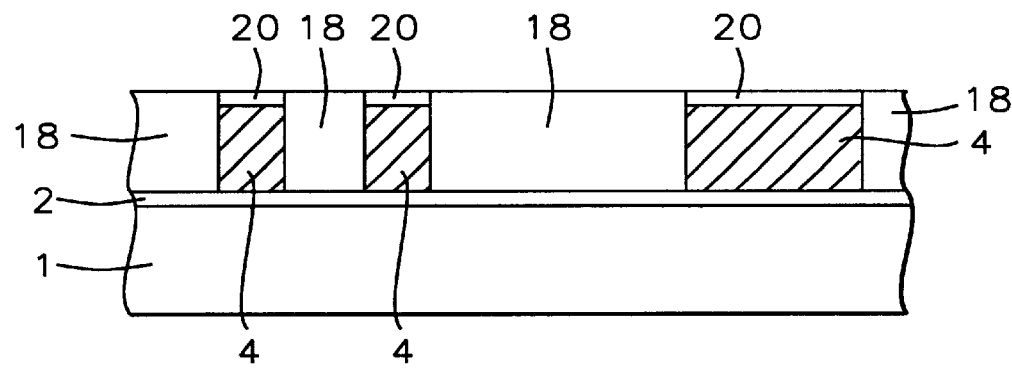

In FIG. 3d, the low dielectric constant material 18 is chemical-mechanical polished (CMP) back with the hard mask 16 in place over the metal. The surface is planarized by the CMP and the process stops on the hard mask, removing some of the hard mask, e.g., silicon oxide, in the process. As shown in FIG. 3d, some of the hard mask remains as the silicon nitride layer 20. At this stage in the process, this invention branches off into two separate embodiments. One embodiment involves a double coating of low dielectric material and the deposition of single or multiple layers of hard mask material, as sketched in FIG. 4a and FIG. 4b. The other embodiment branches off to using an adhesion promoter and stabilization layer for cap oxide over both a hard mask stack and over low dielectric oxide, illustrated in FIG. 5a and FIG. 5b. Combinations of these two branch processing schemes can also be applied. A more detailed description of each branch is given in the next few paragraphs.

Figure 4A:
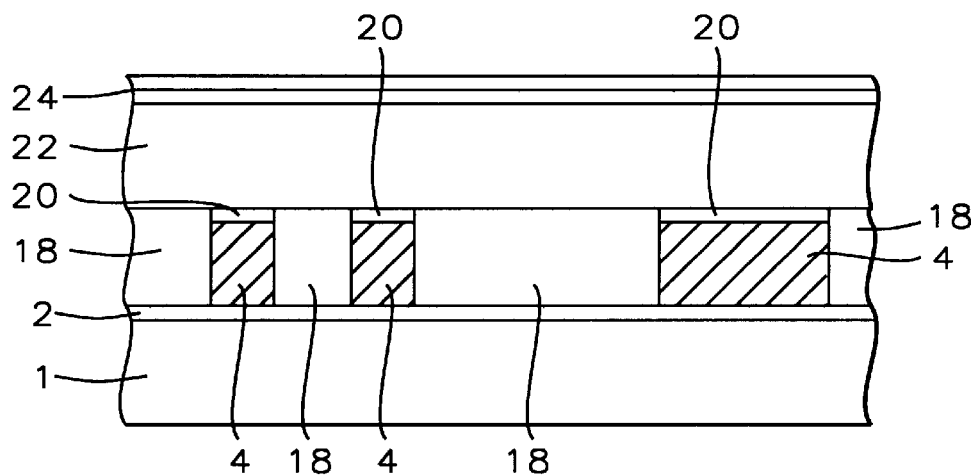
FIGS. 4 *a,b* illustrates use of a hard mask and double coating of low dielectric material.
Figure 4B:
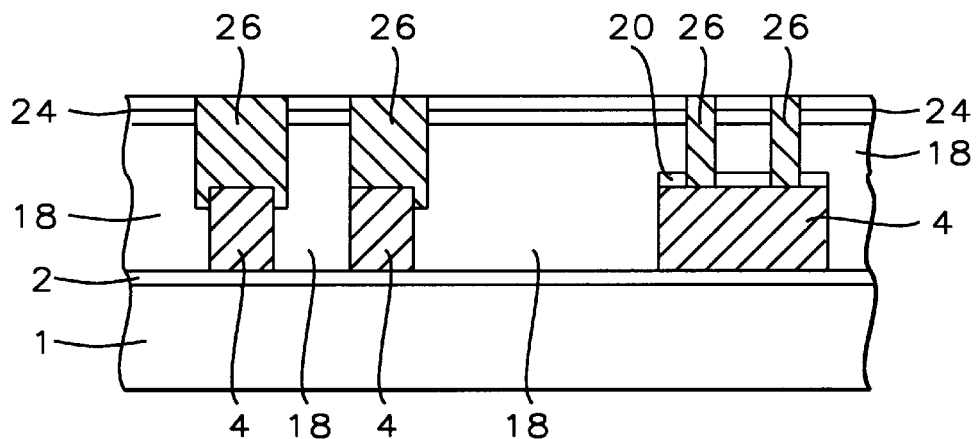

As stated above, the process follows the scheme described and shown in FIGS. 3a–d. Then as illustrated in FIG. 4a, a second layer of low dielectric constant material 22, or double coating, is applied over a hard mask 20 consisting of silicon nitride. Next another hard mask layer is deposited, FIG. 4a over the second low dielectric layer. This second hard mask layer 24 can be composed of just silicon nitride, or just silicon oxide or both materials. This process is followed by via definition and etching for via opening 26, as shown in FIG. 4b. Conductive metal is deposited and excess metal is chemical-mechanical polished (CMP) back to form electrically conductive vias (26) to the interconnect metal lines (4) below.

The process for the second low dielectric constant material above, is the same as described before, organic based polymer, spun on dielectric (SOD) with a thickness from about 4,000 to 12,000 Angstroms and with the curing conditions the same as described before. The second hard mask process conditions are the same as in the first hard mask process, described before.

The process conditions for via opening is the following: reactive ion etch (RIE) for low dielectric constant via opening, RF power from about 800 to 1,500 Watts, pressure from about 300 to 800 milli-Torr, reactive gases and flow rates $N_2$ from about 100 to 300 sccm, $H_2$ from about 100 to 300 sccm, $C_4F_8$ from about 1 to 10 sccm.

The process conditions for the opening of the first hard mask layer are as follows: reactive ion etch (RIE), RF power from about 300 to 1,000 Watts, pressure from about 30 to 100 milli-Torr, gases and flows $CH_2F_2$ from about 10 to 50 sccm, $O_2$ from about 10 to 30 sccm, Ar from about 50 to 200 sccm.

Figure 5A:
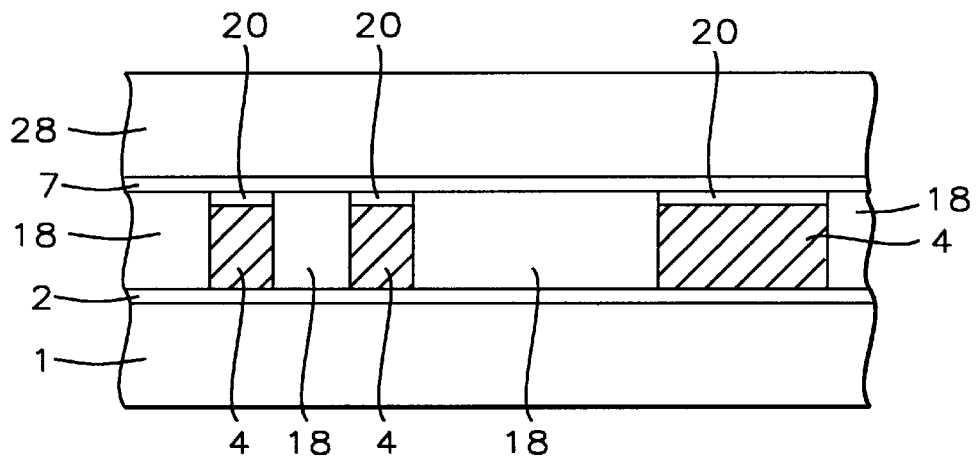
FIGS. 5 *a,b* shows the use of a hard mask in conjunction with an adhesion layer for dielectrics.
Figure 5B:
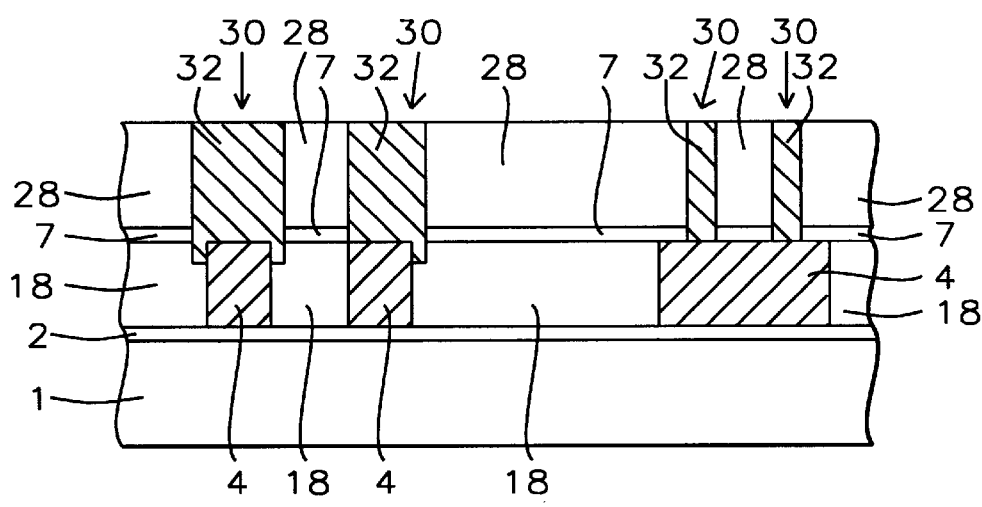

As stated above, the next embodiment of the process follows the same scheme as described and shown in FIGS. 3a–d. Then as illustrated in FIG. 5a, a thin layer of non-oxide adhesion promoter 7, e.g., silicon nitride, is deposited both over the hard mask 20 and the low dielectric constant layer 18. Next a cap oxide layer (28) is deposited, shown in FIG. 5a. This process is followed by via definition and etching for via opening 30, as shown in FIG. 5b. Conductive metal is deposited and excess metal is chemical-mechanical polished (CMP) back to form electrically conductive vias (32) to the interconnect metal lines (4) below.

In summary, several embodiments of this invention were described: (i) the use of a non-oxide adhesion promoter for cap oxide, as illustrated in FIGS. 2 a–d, (ii) the use of a double coating of low dielectric material and double hard mask material, as illustrated in FIGS. 3 a–d and FIGS. 4 a,b, (iii) the use of a hard mask material (with silicon oxynitride DARC, dielectric anti-reflective coating on top of metal stack), in combination with, the use of an adhesion promoter for cap oxide, as sketched in FIGS. 3 a–d and FIGS. 5 a,b. Other combinations of the above embodiments are possible and should be understood as part of this invention, as stated in the next paragraph below.

While the invention has been particularly shown and described with reference to the preferred embodiments thereof, it will be understood by those skilled in the art that various changes in form and details may be made without departing from the spirit and scope of the invention.

What is claimed is:

1. A method for fabricating multilevel metal interconnections having low dielectric constant insulators on a substrate comprising the steps of:

providing a semiconductor substrate having semiconductor devices in and on said substrate;

depositing a first insulating layer over said devices, and further having contact openings in said first insulating layer for electrical contacts to said devices;

forming a metal barrier layer on said insulating layer and in said contact openings;

depositing a first conductive layer for contacting said contact openings;

patterning said first conductive layer and said metal barrier layer to form first metal lines as interconnections for said devices;

coating a layer of low dielectric constant insulating material on and in between said patterned interconnect metal lines;

curing the low dielectric constant material;

depositing thin layer of an adhesion promoter and stabilizing material on the low dielectric constant material;

depositing a silicon oxide cap layer on the adhesion promoter and over the low dielectric constant material;

planarizing the oxide surface with chemical mechanical polish (CMP);

defining via openings and etching to open electrical contacts to the underlying interconnect metal;

depositing conductive metal over the via openings;

removing the excess said conductive metal by CMP;

patterning of said conductive layer to form the next level of metal interconnections.

2. The method of claim 1, wherein said low dielectric constant material is SOD, spun on dielectric, especially organic compounds and is coated by a spin-on coater to a thickness of about 4,000 to 12,000 Angstroms, having a dielectric constant of less than 2.8 with curing conditions at 400° C. for 1 hr., nitrogen ambient gas flow from about 1 to 30 SLM, oxygen less than 10 ppm.

3. The method of claim 1, wherein said layer of adhesion promoter and stabilizer is a non-oxide compound, e.g., silicon nitride deposited by PECVD, plasma enhanced chemical vapor deposition in the thickness range from about 200 to 500 Angstroms.

4. The method of claim 1, wherein said layer of cap oxide or oxide cap is silicon oxide deposited by PECVD, plasma enhanced chemical vapor deposition in the thickness range from about 4,000 to 16,000 Angstroms, having a dielectric constant of about 4.0.

5. The method of claim 1, wherein multilevel metal processing can be performed on the planar surface by repeating the said process steps.

6. A method for fabricating multilevel metal interconnections having low dielectric constant insulators on a substrate comprising the steps of:

providing a semiconductor substrate having semiconductor devices in and on said substrate;

depositing a first insulating layer over said devices, and further having contact openings in said first insulating layer for electrical contacts to said devices;

forming a metal barrier layer on said insulating layer and in said contact openings;

depositing a first conductive layer for contacting said contact openings and forming a metal stack on the interlevel dielectric layer (ILD);

depositing hard mask layer of silicon nitride and then silicon oxide on top of metal layer, with silicon oxynitride DARC, dielectric anti-reflective coating on top of metal stack;

patterning said metal stack consisting of hard mask layer and metal stack layer with said metal barrier layer to form first metal lines as interconnections for said devices;

coating a layer of low dielectric constant insulating material on and in between said patterned interconnect metal lines;

curing the low dielectric constant material;

chemical mechanical polishing (CMP) back and planarizing the surface of said low dielectric constant material with hard mask on top of metal stack;

stopping the CMP polishing on the hard mask layer;

coating the surface with a second layer of low dielectric material; curing the low dielectric constant material;

depositing a second hard mask layer of silicon nitride and then silicon oxide over the second low dielectric constant layer;

defining via openings and etching for vias to open vias to the underlying interconnect metal;

depositing conductive metal and forming metal contacts by chemical mechanical polishings (CMP) the excess metal, stopping on the polishing on the hard mask layer, thus forming low dielectric constant, low capacitance structures.

7. The method of claim 6, wherein said first hard mask layer is composed of silicon nitride and silicon oxide is deposited by PECVD, plasma enhanced chemical vapor deposition to a thickness of about 200 to 500 Angstroms of silicon nitride and to thickness of about 1,000 to 2,000 Angstroms of silicon oxide.

8. The method of claim 6, wherein said first low dielectric constant material is SOD, spun on dielectric, especially low dielectric organic compounds, and is coated by a spin-on coater to a thickness of about 4,000 to 12,000 Angstroms, having a dielectric constant of less than 2.8, with curing conditions of 400° C., 1 hr., $N_2$ gas flow 1 to 30 SLM, $O_2$ less than 10 ppm.

9. The method of claim 6, wherein said chemical mechanical polishing (CMP) conditions are: polishing rate 1,000 to 2,500 A/min, platen speed of 20 to 80 rpm, carry speed of 20 to 80 rpm, downward force 2 to 8 psi, backside pressure from 1 to 7 psi, polishing back and stopping on the first hard mask.

10. The method of claim 6, wherein said second low dielectric constant material is SOD, spun on dielectric, low dielectric organic compounds especially, and coated by a spin-on coater to a thickness of about 4,000 to 12,000 Angstroms, having a dielectric constant of about of less than 2.8, with curing conditions of 400° C., 1 hr., $N_2$ gas flow 1 to 30 SLM, $O_2$ less than 10 ppm.

11. The method of claim 6, wherein said second hard mask layer is composed of silicon nitride and silicon oxide is deposited by PECVD, plasma enhanced chemical vapor deposition to a thickness of about 200 to 500 Angstroms of silicon nitride and to a thickness of about 1,000 to 2,000 Angstroms of silicon oxide.

12. The method of claim 6, wherein said hard mask layers, both first and second hard mask layers can be composed of silicon nitride and silicon oxide, or solely silicon nitride, or solely silicon oxide.

13. The method of claim 6, wherein said chemical mechanical polishing (CMP) conditions are: polishing rate 1,000 to 2,500 A/min, platen speed of 20 to 80 rpm, carry speed of 20 to 80 rpm, downward force 2 to 8 psi, backside pressure from 1 to 7 psi, polishing back and stopping on the second hard mask.

14. The method of claim 6, wherein multilevel metal processing can be performed on the planar surface by repeating the said process steps.

15. A method for fabricating multilevel metal interconnections having low dielectric constant insulators on a substrate comprising the steps of:

providing a semiconductor substrate having semiconductor devices in and on said substrate;

depositing a first insulating layer over said devices, and further having contact openings in said first insulating layer for electrical contacts to said devices;

forming a metal barrier layer on said insulating layer and in said contact openings;

depositing a first conductive layer for contacting said contact openings and forming a metal stack with a silicon oxynitride DARC, dielectric anti-reflective coating, on top of metal, on the interlevel dielectric layer (ILD);

depositing hard mask layer of silicon nitride and then silicon oxide on top of metal layer;

patterning said metal stack consisting of hard mask layer and metal stack layer with said metal barrier layer to form first metal lines as interconnections for said devices;

coating a layer of low dielectric constant insulating material on and in between said patterned interconnect metal lines;

curing the low dielectric constant material;

chemical mechanical polishing (CMP) back and planarizing the surface of said low dielectric constant material with hard mask on top of metal stack;

stopping the CMP polishing on the hard mask layer;

depositing a layer of adhesion promoter over the hard mask and low dielectric constant layer;

depositing a silicon oxide cap layer on the adhesion promoter layer defining via openings and etching to open electrical contacts to the underlying interconnect metal;

depositing conductive metal over the via openings;

removing the excess said conductive metal by CMP;

patterning of said conductive layer to form the next level of metal interconnections.

16. The method of claim 15, wherein said hard mask layer is composed of silicon nitride and silicon oxide is deposited by PECVD, plasma enhanced chemical vapor deposition, to a thickness of about 200 to 500 Angstroms of silicon nitride and to a thickness of about 1,000 to 2,000 Angstroms of silicon oxide.

17. The method of claim 15, wherein said hard mask layer can be composed of silicon nitride and silicon oxide, or solely silicon nitride, or solely silicon oxide.

18. The method of claim 15, wherein said low dielectric constant material is low dielectric constant SOD, spun on dielectric, low dielectric organic compounds especially, and coated by a spin-on coater to a thickness of about 4,000 to 12,000 Angstroms, having a dielectric constant of about of less than 2.8, with curing conditions of 400° C., 1 hr., $N_2$ gas flow 1 to 30 SLM, $O_2$ less than 10 ppm.

19. The method of claim 15, wherein said chemical mechanical polishing (CMP) conditions are: polishing rate 1,000 to 2,500 A/min, platen speed of 20 to 80 rpm, carry speed of 20 to 80 rpm, downward force 2 to 8 psi, backside pressure from 1 to 7 psi, polishing back and stopping on the hard mask.

20. The method of claim 15, wherein said layer of adhesion promoter and stabilizer is silicon nitride deposited by PECVD, plasma enhanced chemical vapor deposition in the thickness range from about 200 to 500 Angstroms, which is deposited on hard mask material.

21. The method of claim 15, wherein said layer of cap oxide is silicon oxide deposited by PECVD, plasma enhanced chemical vapor deposition, in the thickness range from about 4,000 to 12,000 Angstroms, having a dielectric constant of about 4.0, which is deposited on the adhesion promoter.

22. The method of claim 15, wherein multilevel metal processing can be performed on the planar surface repeating the said process steps.

* * * * *